(12) United States Patent
Kim et al.

(10) Patent No.: US 8,264,904 B2
(45) Date of Patent: Sep. 11, 2012

(54) METHOD OF ESTIMATING SELF REFRESH PERIOD OF SEMICONDUCTOR MEMORY DEVICE

(75) Inventors: Hyung-Dong Kim, Suwon-si (KR); Byung-Hwan So, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 346 days.

(21) Appl. No.: 12/798,196

(22) Filed: Mar. 31, 2010

(65) Prior Publication Data
US 2010/0302883 A1 Dec. 2, 2010

(30) Foreign Application Priority Data

May 27, 2009 (KR) .......................... 10-2009-0046476

(51) Int. Cl.
*G11C 7/00* (2006.01)

(52) U.S. Cl. ............... 365/222; 365/230.01; 365/230.09

(58) Field of Classification Search .................. 365/222, 365/230.01, 230.09
See application file for complete search history.

(56) References Cited

U.S. PATENT DOCUMENTS
2003/0128613 A1* 7/2003 Ariki ............................ 365/222

FOREIGN PATENT DOCUMENTS
| JP | 06103757 | 4/1994 |
| JP | 2002074994 | 3/2002 |
| JP | 2003203497 | 7/2003 |

* cited by examiner

Primary Examiner — Jason Lappas
(74) Attorney, Agent, or Firm — Onello & Mello, LLP

(57) ABSTRACT

In a method of estimating a self refresh period of a semiconductor memory device according to an exemplary embodiment, a plurality of internal address signals are reset in response to a refresh reset signal. The plurality of internal address signals are sequentially changed synchronously with an oscillation signal. A refresh completion signal is generated based on the plurality of internal address signals. The self refresh period is detected based on the refresh reset signal and the refresh completion signal.

20 Claims, 9 Drawing Sheets

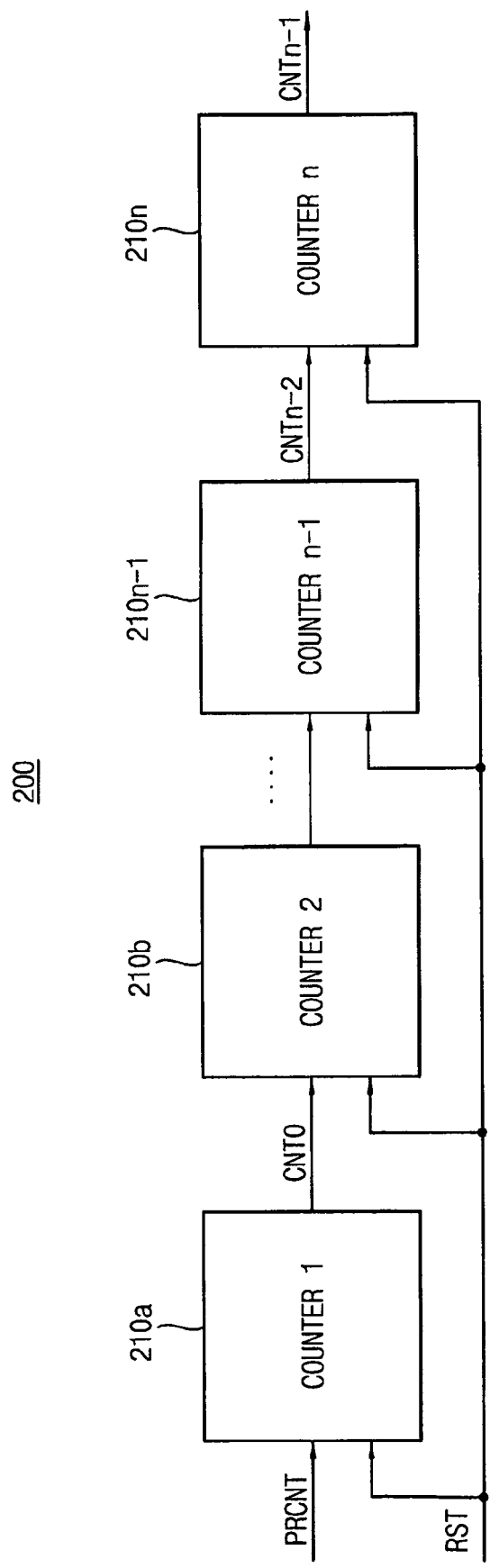

METHOD OF ESTIMATING SELF REFRESH PERIOD OF SEMICONDUCTOR MEMORY DEVICE

CROSS-REFERENCE TO RELATED APPLICATION

This application claims priority under 35 USC §119 to Korean Patent Application No. 2009-0046476, filed on May 27, 2009 in the Korean Intellectual Property Office (KIPO), the contents of which are herein incorporated by reference in their entirety.

BACKGROUND

1. Field

Exemplary embodiments of the present inventive concept relate to a semiconductor memory device, and more particularly to a method of estimating a self refresh period of a semiconductor memory device.

2. Description of the Related Art

A semiconductor memory device may be used to store data and to read stored data. Generally, semiconductor memory devices may be categorized as volatile semiconductor memory devices or non-volatile semiconductor memory devices. The volatile semiconductor memory devices may include dynamic random access memories (DRAMs) and static random access memories (SRAMs). There are some distinct differences between the volatile semiconductor memory devices and the non-volatile semiconductor memory devices. For example, the volatile semiconductor memory devices lose the stored data when power is off, but the non-volatile semiconductor memory devices retain the stored data even when the power is off.

Depending on a structure of memory cells, the volatile semiconductor memory devices may lose the stored data due to a leakage current even while the power is supplied. Thus, in such volatile semiconductor memory devices, the data stored in the memory cells need to be refreshed in order to prevent a loss of the stored data.

SUMMARY

Accordingly, the inventive concept is provided to substantially obviate one or more problems due to limitations and disadvantages of the related art.

Exemplary embodiments of the present inventive concept provide a method of estimating a self refresh period of a semiconductor memory device.

Exemplary embodiments of the present inventive concept provide a semiconductor memory device configured to estimate a self refresh period.

Exemplary embodiments provide a test system configured to estimate a self refresh period.

According to one aspect of the present inventive concept, in a method of estimating a self refresh period of a semiconductor memory device, a plurality of internal address signals are reset in response to a refresh reset signal in a test mode. The plurality of internal address signals are sequentially changed synchronously with an oscillation signal. A refresh completion signal is generated based on the plurality of internal address signals. The self refresh period is detected based on the refresh reset signal and the refresh completion signal.

In one embodiment, generating the refresh completion signal includes generating the refresh completion signal by performing a logical operation on the plurality of the internal address signals.

In one embodiment, detecting the self refresh period includes determining an enable time of the refresh reset signal as a starting point of the self refresh period, determining an enable time of the refresh completion signal as an ending point of the self refresh period and detecting the self refresh period by calculating a time difference between the ending point of the self refresh period and the starting point of the self refresh period.

In one embodiment, resetting the plurality of internal address signals includes setting logic levels of all of the plurality of internal address signals to a first logic level in response to the refresh reset signal. In another embodiment, generating the refresh completion signal includes enabling the refresh completion signal when the logic levels of all of the plurality of internal address signals transition to a second logic level from the first logic level. In another embodiment, the refresh completion signal may be enabled by performing an AND operation on the plurality of the internal address signals when the first logic level is a logic low level and the second logic level is a logic high level or by performing an OR operation on the plurality of the internal address signals when the first logic level is a logic high level and the second logic level is a logic low level.

In one embodiment, the refresh reset signal may be enabled after the oscillation signal is stabilized.

In one embodiment, the refresh reset signal may be applied from an external device.

In one embodiment, the refresh reset signal may be disabled in a normal mode.

In one embodiment, the method further includes determining whether the semiconductor memory device is passed or failed based on a tolerance of a reference self refresh period.

According to another aspect of the present inventive concept, a semiconductor memory device includes an oscillator, an address counter and a period detector. The oscillator generates an auto refresh signal in response to a self refresh initiation signal. The address counter is configured to reset a plurality of internal address signals in response to a refresh reset signal and configured to sequentially change the plurality of internal address signals synchronously with the auto refresh signal. The period detector generates a self refresh period signal based on the plurality of internal address signals and the refresh reset signal.

In one embodiment, the period detector may include a logical operator and a period calculator. The logical operator may perform a logical operation on the plurality of internal address signals to generate a refresh completion signal. The period calculator may be configured to generate the self refresh period signal based on the refresh reset signal and the refresh completion signal. In another embodiment, the period calculator may determine an enable time of the refresh reset signal as a starting point of the self refresh period, may determine an enable time of the refresh completion signal as a ending point of the self refresh period and may calculate a time difference between the ending point of the self refresh period and the starting point of the self refresh period to generate the self refresh period signal.

In another embodiment, the address counter may reset logic levels of all of the plurality of internal address signals to a first logic level in response to the refresh reset signal. In another embodiment, the address counter may enable the refresh completion signal when the logic levels of all of the plurality of internal address signals transition to a second logic level from the first logic level.

In one embodiment, the address counter may include a plurality of counters cascade-coupled from a first stage to a last stage. Each of the plurality of counters may generate one of the plurality of internal address signals.

In another embodiment, each of the plurality of counters may include an inverter and a plurality of transistors. The inverter may invert the refresh reset signal. The plurality of transistors may provide a source voltage in response to the inverted refresh reset signal.

According to another aspect of the present inventive concept, a test system includes a semiconductor memory device and a tester. The semiconductor memory device is configured to generate an auto refresh signal in response to a self refresh initiation signal, configured to reset a plurality of internal address signals in response to a refresh reset signal, configured to sequentially change the plurality of internal address signals synchronously with the auto refresh signal and configured to generate a refresh completion signal based on the plurality of internal address signals. The tester is configured to generate the self refresh initiation signal and the refresh reset signal and generates the self refresh period signal based on the refresh reset signal and the refresh completion signal.

In one embodiment, the semiconductor memory device may include an oscillator, an address counter and a logical operator. The oscillator may be configured to generate the auto refresh signal in response to the self refresh initiation signal. The address counter may configured to reset the plurality of internal address signals in response to the refresh reset signal and may be configured to sequentially change the plurality of internal address signals synchronously with the auto refresh signal. The logical operator may be configured to generate the refresh completion signal based on the plurality of internal address signals.

In one embodiment, the tester may include a controller and a period calculator. The controller may be configured to generate the self refresh initiation signal and the refresh reset signal. The period calculator may be configured to generate the self refresh period signal based on the refresh reset signal and the refresh completion signal.

Accordingly, in the semiconductor memory device, the test system and the method according to the exemplary embodiments, the self refresh period may be detected effectively by calculating the time difference between the enable time of the refresh completion signal and the enable time of the refresh reset signal, instead of periodically detecting and storing the internal address signals, thereby reducing power consumption.

BRIEF DESCRIPTION OF THE DRAWINGS

The foregoing and other features and advantages of the inventive concept will be apparent from the more particular description of preferred aspects of the inventive concept, as illustrated in the accompanying drawings in which like reference characters refer to the same parts throughout the different views. The drawings are not necessarily to scale, emphasis instead being placed upon illustrating the principles of the inventive concept. In the drawings, the thickness of layers and regions are exaggerated for clarity.

FIG. 2A is a block diagram illustrating an exemplary embodiment of an address counter included in the semiconductor memory device of FIG. 1.

DETAILED DESCRIPTION OF THE EMBODIMENTS

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another. Thus, a first element, component, region, layer or section discussed below could be termed a second element, component, region, layer or section without departing from the scope of the inventive concept.

It will be understood that when an element is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 1:
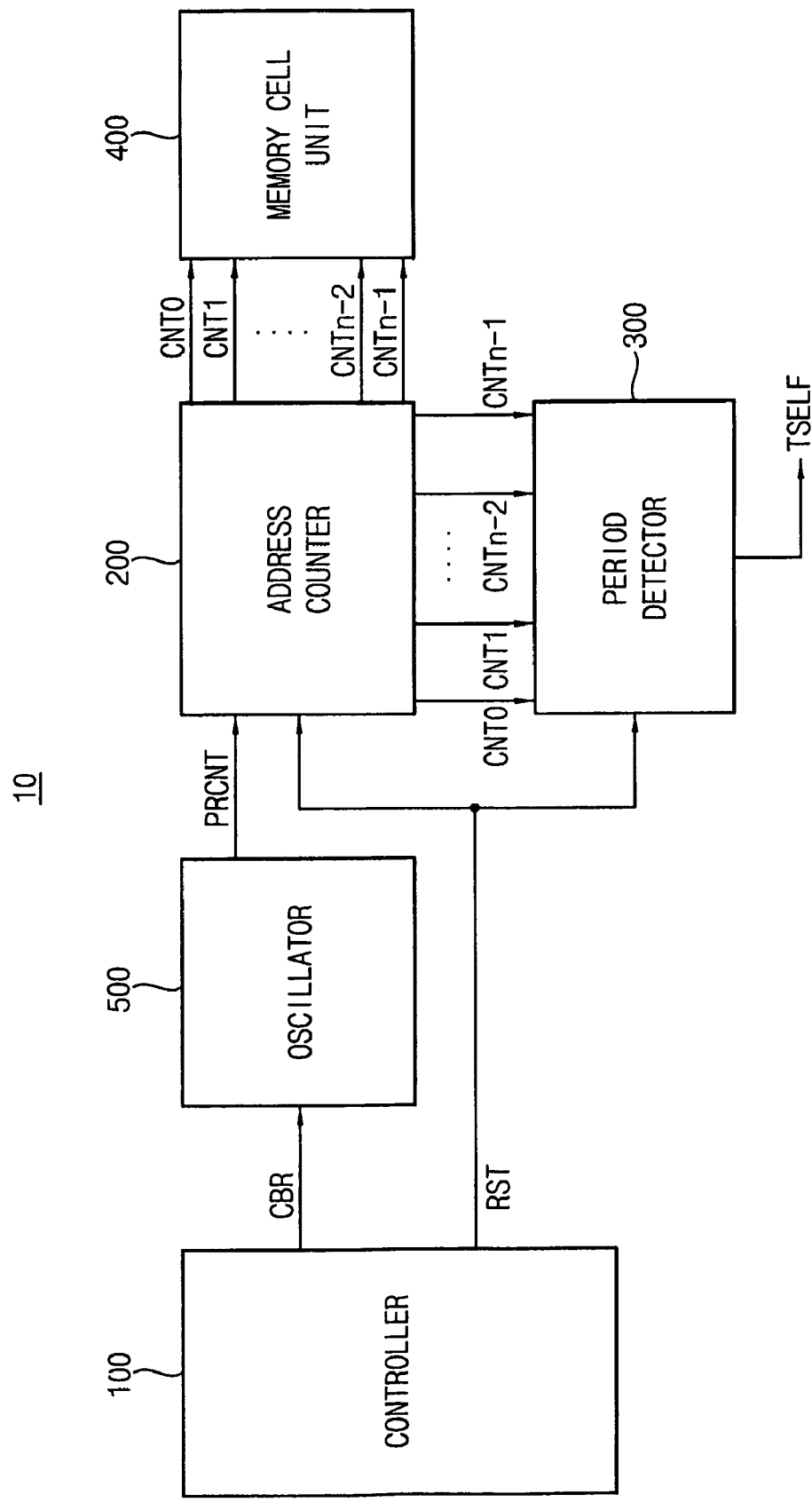
FIG. 1 is a block diagram illustrating a semiconductor memory device, according to an exemplary embodiment of the present inventive concept.

FIG. 1 is a block diagram illustrating a semiconductor memory device 10, according to an exemplary embodiment of the present inventive concept.

Referring to FIG. 1, the semiconductor memory device 10 includes a controller 100, an address counter 200, a period detector 300, a memory cell unit 400 and an oscillator 500.

In a normal mode, the controller 100 generates a self refresh initiation signal CBR when the semiconductor memory device 10 satisfies a predetermined timing condition. For example, the predetermined timing condition may be satisfied if a predetermined time, for example, about 100 μs, has elapsed after a column address strobe (CAS) signal is applied and prior to a row address strobe (RAS) signal. In the normal mode, the controller 100 may generate the self refresh initiation signal CBR, even though the controller 100 does not receive an external command signal related to a refresh operation. The semiconductor memory device 10 may perform a self refresh operation when the controller 100 provides the self refresh initiation signal CBR.

In a test mode, the controller 100 generates the self refresh initiation signal CBR, even when the semiconductor memory device 10 does not satisfy the above-mentioned predetermined timing condition. The semiconductor memory device 10 may be configured to estimate a self refresh period in the test mode. In the test mode, the controller 100 may generate the self refresh initiation signal CBR in response to an external command signal applied from an external device such as a tester.

Hereinafter, the semiconductor memory device and the method of estimating the self refresh period according to exemplary embodiments will be described based on the semiconductor memory device operating in the test mode.

The semiconductor memory device 10 may be a volatile semiconductor memory device, such as dynamic random access memory (DRAM). The semiconductor memory device 10 includes a plurality of memory cells included in the memory cell unit 400 and each of the memory cells includes a transistor and a capacitor. The semiconductor memory device 10 retains data in a form of charges stored in the capacitor. The charges stored in the capacitor may be gradually decreased as time elapses due to leakage current, and, thus, the stored data may be lost. Thus, in the semiconductor memory device 10, a refresh operation needs to be performed in order to retain the stored data. The refresh operation may be performed periodically by reading the stored data and recharging the capacitor. The refresh operations may be performed regardless of an external refresh command, which is referred to as a self refresh operation.

The semiconductor memory device 10 may sense the data stored in each memory cell, amplify the sensed data and restore the amplified data in each memory cell in performing the self refresh operation. The semiconductor memory device 10 may repeat such sensing, amplifying and restoring operations row by row, that is, by a unit of a row of memory cells.

As the self refresh operation is performed frequently, probability of data loss may be reduced. However, in the semiconductor memory devices used in a portable device, such as a cellular phone, a personal digital assistant (PDA), or the like, power consumption is required to be reduced by increasing the self refresh period, since a capacity of a battery in the portable device is limited. Thus, it is important to estimate the self refresh period exactly. Exact and rapid estimation of the self refresh period during a test of the semiconductor memory device may enhance productivity of the semiconductor memory device.

In the normal mode, the semiconductor memory device 10 performs the self refresh operation in response to the self refresh initiation signal CBR generated in the semiconductor memory device 10, and, thus, it is difficult to estimate exactly the self refresh period based on the self refresh initiation signal CBR. In the test mode, the semiconductor memory device 10 performs the self refresh operation based on the self refresh initiation signal CBR and an auto refresh signal PRCNT. In the test mode, the self refresh initiation signal CBR may be generated in response to the external command signal and the auto refresh signal PRCNT may be generated by the oscillator 500 in response to the self refresh initiation signal CBR. However, the semiconductor memory device 10 does not simultaneously generate the self refresh initiation signal CBR and the auto refresh signal PRCNT, because the auto refresh signal PRCNT may be stabilized after a predetermined locking time has elapsed. Thus, it is difficult to estimate exactly the self refresh period based on the auto refresh signal PRCNT in the test mode.

The oscillator 500 receives the self refresh initiation signal CBR and generates the auto refresh signal PRCNT for performing the self refresh operation. The auto refresh signal PRCNT may be an oscillation signal. The address counter 200 operates in response to the auto refresh signal PRCNT. For example, the auto refresh signal PRCNT may correspond to a clock signal and the address counter 200 may operate synchronously with the auto refresh signal PRCNT.

Although the oscillator 500 enables (or activates) the auto refresh signal PRCNT in response to the self refresh initiation signal CBR, an enable time (or an activation time) of the auto refresh signal PRCNT may be delayed from an enable time of the self refresh initiation signal CBR because the oscillator 500 can be stabilized after a predetermined setting time has elapsed. The predetermined setting time may be the same as the predetermined locking time. Thus, a starting point of the self refresh operation may be different from the enable time of the self refresh initiation signal CBR, and, thus, it is difficult to estimate exactly the self refresh period, if the semiconductor memory device 10 determines the enable time of the self refresh initiation signal CBR as the starting point of the self refresh period.

The semiconductor memory device 10 according to exemplary embodiments may estimate exactly the self refresh period based on a refresh reset signal RST and internal address signals CNT0, CNT1, . . . , CNTn−2, CNTn−1, as described hereinafter.

The address counter 200 generates the plurality of internal address signals CNT0, CNT1, . . . , CNTn−2, and CNTn−1 synchronously with the auto refresh signal PRCNT. The number of the plurality of internal address signals CNT0 through CNTn−1 may correspond to the number of rows of a memory cell array included in the memory cell unit 400. Each of the internal address signals CNT0 through CNTn−1 may correspond to one of the bits of an internal address and the plurality of internal address signals CNT0 through CNTn−1 may correspond to the internal address.

In the test mode, the address counter 200 operates synchronously with the auto refresh signal PRCNT and resets the internal address signals CNT0 through CNTn−1 in response to the refresh reset signal RST that is received from the controller 100. The address counter 200 may reset logic levels of all of the internal address signals CNT0 through CNTn−1 to a first logic level. For example, the first logic level may be a logic low level.

After the reset operation, the address counter 200 sequentially changes the logic levels of the internal address signals CNT0 through CNTn−1 synchronously with the auto refresh signal PRCNT. The address counter 200 may sequentially generate the internal address that corresponds to each row of the memory cell array in accordance with the change of the logic levels of the internal address signals CNT0 through CNTn−1. The data stored in each row of the memory cell array is sequentially refreshed in response to the internal address. When the address counter 200 counts all of the rows of the memory cell array, the logic levels of all of the internal address signals CNT0 through CNTn−1 transition from the first logic level to a second logic level, all of the stored data are self-refreshed, and, thus the self refresh operation is completed. For example, the second logic level may be a logic high level. The self refresh period may be estimated to be a time interval from a timing point when the refresh reset signal RST is enabled to a timing point when all of the logic levels of the internal address signals CNT0 through CNTn−1 transition to the second logic level from the first logic level.

In an exemplary embodiment, the address counter 200 may be a ripple counter that includes a plurality of toggle flip-flops cascade-coupled from a first stage to a last stage, as illustrated in FIG. 2A.

The period detector 300 receives the refresh reset signal RST from the controller 100. The period detector 300 may determine the enable time of the refresh reset signal RST as the starting point of the self refresh period, because the self refresh operation may be initiated in response to the reset of the internal address signals CNT0 through CNTn−1.

The period detector 300 also receives the internal address signals CNT0 through CNTn−1 from the address counter 200. Since the self refresh operation may be completed when the logic levels of all of the internal address signals CNT0 through CNTn−1 become the second logic level, the period detector 300 may determine the ending point of the self refresh period based on the logic levels of the internal address signals CNT0 through CNTn−1. For example, the period detector 300 may enable a refresh completion signal when all of the logic levels of the internal address signals CNT0 through CNTn−1 transition to the second logic level from the first logic level, and may determine an enable time of the refresh completion signal as the ending point of the self refresh period. The period detector 300 may detect a time difference between the enable time of the refresh completion signal and the enable time of the refresh reset signal RST to detect the self refresh period. As such, the period detector 300 may generate the self refresh period signal TSELF which indicates the self refresh period based on the refresh reset signal RST and the internal address signals CNT0 through CNTn−1.

The memory cell unit 400 may include the memory cell array, an address buffer, a row selection circuit, a column selection circuit, a sense amplifier and a buffer circuit (not shown). The row selection circuit sequentially receives the internal address signals CNT0 through CNTn−1 from the address counter 200 to select each row of the memory cell array. The memory cell array senses data stored in the memory cells of the selected row through bit lines. The sense amplifier amplifies the sensed data and stores the amplified data in the buffer circuit. The memory cell array re-writes the data stored in the buffer circuit to the memory cells of the selected row through the bit lines.

In the semiconductor memory device, according to exemplary embodiments, the semiconductor memory device 10 may determine the enable time of the refresh reset signal RST as the starting point of the self refresh period, whereas conventional semiconductor memory devices determine the starting point of the self refresh period by periodically detecting a voltage level of the auto refresh signal PRCNT generated from the oscillator 500. In addition, the semiconductor memory device 10 may determine a point of time at which the logic levels of all of the internal address signals CNT0 through CNTn−1 transition to the second logic level as the ending point of the self refresh period. Thus, the self refresh period may be estimated exactly and rapidly.

FIG. 2A is a block diagram illustrating an exemplary embodiment of the address counter 200 included in the semiconductor memory device 10 of FIG. 1.

Referring to FIG. 2A, the address counter 200 may include a plurality of counters 210a, 210b, . . . , 210n−1, 210n.

The plurality of counters 210a through 210n may be cascade-coupled from the first stage to the last stage and may include a toggle flip-flop, respectively. The number of the counters 210a through 210n may be the same as the number of the internal address signals CNT0 through CNTn−1. The number of bits of the internal address corresponding to the internal address signals CNT0 through CNTn−1 may be the same as the number of the rows of the memory cell array. Each of the counters 210a through 210n generates one of the internal address signals CNT0 through CNTn−1 in response to the refresh reset signal RST and an output signal of the previous stage. The output signal of the previous stage may be the auto refresh signal PRCNT in a first counter 210a. Each of the internal address signals CNT0 through CNTn−1 may correspond to one of the bits of the internal address. For example, the first counter 210a may generate a first internal address signal CNT0 based on the auto refresh signal PRCNT and the refresh reset signal RST. The first internal address signal CNT0 may correspond to a least significant bit (LSB) of the internal address. An n-th counter 210n may generate an n-th internal address signal CNTn−1 based on a (n−1)-th internal address signal CNTn−2 and the refresh reset signal RST. The n-th internal address signal CNTn−1 may correspond to a most significant bit (MSB) of the internal address.

The address counter 200 may perform an up-counting operation or a down-counting operation, according to exemplary embodiments. The address counter 200 generates the internal address signals CNT0 through CNTn−1 in response to the auto refresh signal PRCNT and the refresh reset signal RST. The address counter 200 resets the internal address signals CNT0 through CNTn−1 in response to the refresh reset signal RST such that all of the logic levels of the internal address signals CNT0 become the first logic level. The address counter 200 sequentially changes the logic levels of the internal address signals CNT0 through CNTn−1 synchronously with the auto refresh signal PRCNT. That is, the address counter 200 sequentially up-counts or down-counts the internal address bit by bit. For example, if the first logic level is a logic low level, the address counter 200 may up-count the internal address bit by bit synchronously with the auto refresh signal PRCNT. The address counter 200 may sequentially generate the internal address corresponding to each row of the memory cell array. When the address counter 200 completes the up-counting operation for all of the rows of the memory cell address, the logic levels of all of the internal address signals CNT0 through CNTn−1 transition to the second logic level, such as a logic high level. The refresh completion signal may be enabled in response to the internal address signals CNT0 through CNTn−1 transitioning to the second logic level.

Figure 2B:
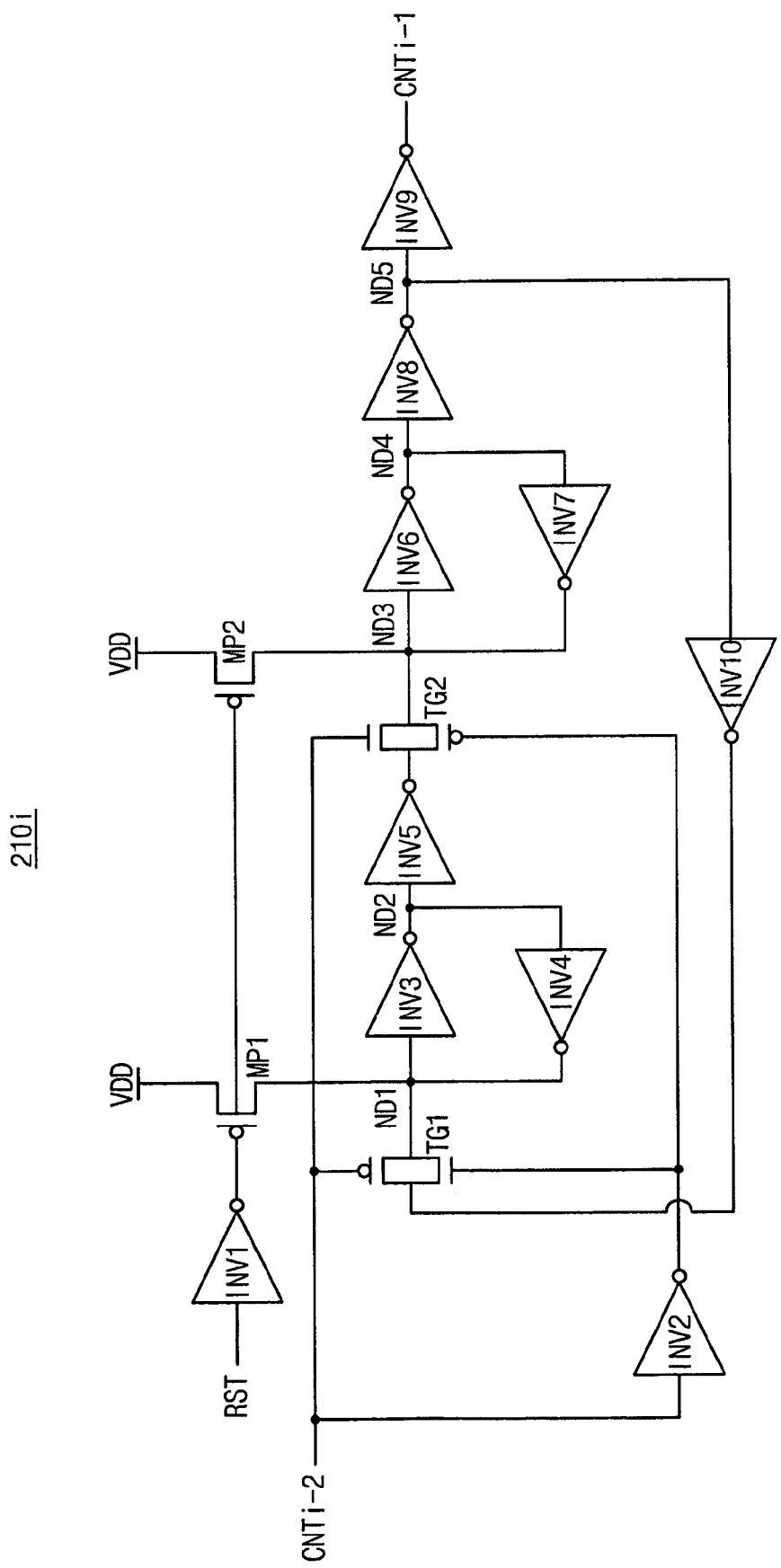
FIG. 2B is a circuit diagram illustrating an exemplary embodiment of a counter included in the address counter of FIG. 2A.

FIG. 2B is a circuit diagram illustrating an exemplary embodiment of a counter 210i included in the address counter 200 of FIG. 2A.

The counter 210i includes a plurality of inverters INV1, INV2, INV3, INV4, INV5, INV6, INV7, INV8, INV9 and INV10, a plurality of transistors MP1 and MP2 and a plurality of transmission gates TG1 and TG2.

A first inverter INV1 inverts the refresh reset signal RST. A first p-type metal oxide semiconductor (PMOS) transistor MP1 has a first end, for example, a source, coupled to a source voltage VDD, a second end, for example, a drain, coupled to a first node ND1 and a gate coupled to an inverted refresh reset signal. A second PMOS transistor MP2 has a first end, for example, a source, coupled to the source voltage VDD, a second end, for example, a drain, coupled to a third node ND3 and a gate coupled to the inverted refresh reset signal. The first PMOS transistor MP1 provides the source voltage VDD to the first node ND1 in response to the inverted refresh reset signal such that a logic level of the first node ND1 becomes a logic high level. The second PMOS transistor MP2 provides the source voltage VDD to the third node ND3 in response to the inverted refresh reset signal such that a logic level of the third node ND3 becomes a logic high level.

In the test mode, when the self refresh operation is initiated in response to the refresh reset signal RST, the logic levels of all of the first and third nodes ND1 and ND3 become the logic high level, and, thus, the internal address signals CNT0 through CNTn−1 are reset such that all of the logic levels of the internal address signals CNT0 through CNTn−1 become the first logic level, such as a logic low level.

A second inverter INV2 inverts an (i−1)-th internal address signal CNTi−2 that is provided from a previous stage. A first transmission gate TG1 and a second transmission gate TG2 operate in a complementary manner in response to the (i−1)-th internal address signal CNTi−2. For example, when a logic level of the (i−1)-th internal address signal CNTi−2 is the logic high level, the first transmission gate TG1 may be turned on and the second transmission gate TG2 may be turned off. The (i−1)-th internal address signal CNTi−2 may be the auto refresh signal PRCNT if the counter 210i may be the first counter 210a of FIG. 2A.

A third inverter INV3 and a fourth inverter INV4 are implemented with the latch circuit between the first node ND1 and a second node ND2, where inputs and outputs of the third and fourth inverters INV3 and INV4 are cross-coupled. The third and fourth inverters INV3 and INV4 store data when the second transmission gate TG2 is off. A fifth inverter INV5 inverts a voltage at the second node ND2. The second transmission gate TG2 provides an output signal of the fifth inverter INV5 to the third node ND3 in response to the (i−1)-th internal address signal CNTi−2.

A sixth inverter INV6 and a seventh inverter INV7 are implemented with the latch circuit between the third node ND3 and a fourth node ND4, where inputs and outputs of the sixth and seventh inverters INV6 and INV7 are cross-coupled. An eighth inverter INV8 is coupled between the fourth node ND4 and a fifth node ND5 and inverts a voltage at the fourth node ND4. A ninth inverter INV9 inverts a voltage at the fifth node ND5 to output an i-th internal address signal CNTn−1. A tenth inverter INV10 inverts the voltage at the fifth node ND5 and provides the inverted signal to the first transmission gate TG1.

Figure 3:
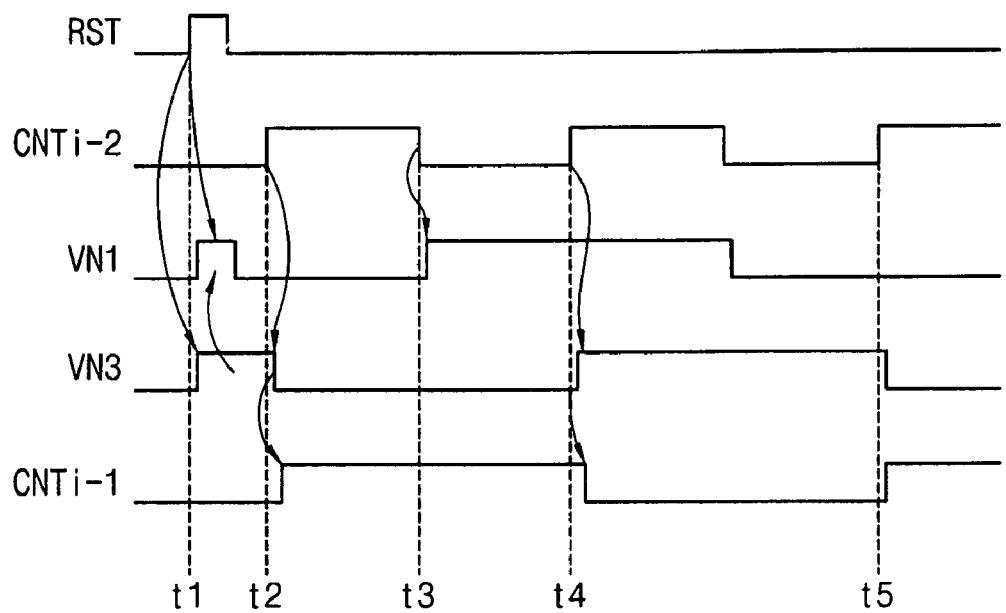
FIG. 3 is a timing diagram illustrating an operation of the counter of FIG. 2B.

FIG. 3 is a timing diagram illustrating an operation of the counter 210i of FIG. 2B.

In FIG. 3, a signal RST indicates the refresh reset signal, a signal CNTi−2 indicates the (i−1)-th internal address signal, a signal VN1 indicates the voltage at the first node ND1, a signal VN3 indicates the voltage at the third node ND3, and a signal CNTi−1 indicates the i-th internal address signal.

At time t1, the refresh reset signal RST is enabled by transitioning from a logic low level to a logic high level. The first inverter INV1 inverts the refresh reset signal RST, the first and second PMOS transistors MP1 and MP2 turn on in response to the inverted refresh reset signal, and logic levels of the voltages at the first and third nodes ND1 and ND3 transition from a logic low level to a logic high level. Thus, the logic level of the i-th internal address signal CNTi−1 is a logic low level regardless of whether the first and second transmission gate TG1 and TG2 are turned on or turned off.

When the refresh reset signal RST is enabled, the logic levels of all of the internal address signals CNT0 through CNTn−1 are reset to the first logic level, such as a logic low level. The logic level of the (i−1)-th internal address signal CNTi−2 also resets to the logic low level, and, thus, the first transmission gate TG1 turns on and the second transmission gate TG2 turns off. The tenth inverter INV10 inverts the voltage at the fifth node ND5 and the first transmission gate TG1 receives the output signal of the tenth inverter INV10. Thus, when the refresh reset signal RST is disabled, the logic level of the voltage at the first node ND1 transitions from the logic high level to the logic low level because a logic level of the voltage at the fifth node ND5 is the logic low level. However, the logic level of the voltage at third node ND3 is maintained in the logic high level and the logic level of the i-th internal address signal CNTi−1 is maintained in the logic low level because the second transmission gate TG2 is off.

At time t2, the logic level of the (i−1)-th internal address signal CNTi−2 transitions from the logic low level to the logic high level in response to the auto refresh signal PRCNT. The first transmission gate TG1 turns off and the second transmission gate TG2 turns on. The logic level of the voltage at the first node ND1 is maintained in the logic low level because the first transmission gate TG1 turns off. The logic level of the voltage at third node ND3 transitions from the logic high level to the logic low level and the logic level of the i-th internal address signal CNTi−1 transitions from the logic low level to the logic high level because the second transmission gate TG2 turns on.

At time t3, the logic level of the (i−1)-th internal address signal CNTi−2 transitions from the logic high level to the logic low level. The first transmission gate TG1 turns on and the second transmission gate TG2 turns off. The logic level of the voltage at the first node ND1 transitions from the logic low level to the logic high level because the first transmission gate TG1 turns on. The logic level of the voltage at third node ND3 is maintained in the logic low level and the logic level of the i-th internal address signal CNTi−1 is maintained in the logic high level because the second transmission gate TG2 turns off.

At time t4, the logic level of the (i−1)-th internal address signal CNTi−2 transitions from the logic low level to the logic high level. The first transmission gate TG1 turns off and the second transmission gate TG2 turns on. The logic level of the voltage at the first node ND1 is maintained in the logic high level. The logic level of the voltage at third node ND3 transitions from the logic low level to the logic high level and the logic level of the i-th internal address signal CNTi−1 transitions from the logic high level to the logic low level. At time t5, an operation of the counter 200i may be similar to the operation of the counter at time t2. Specifically, at time t5, the logic level of the (i−1)-th internal address signal CNTi−2 transitions from the logic low level to the logic high level in response to the auto refresh signal PRCNT. The first transmission gate TG1 turns off and the second transmission gate TG2 turns on. The logic level of the voltage at the first node ND1 is maintained in the logic low level because the first transmission gate TG1 turns off. The logic level of the voltage at third node ND3 transitions from the logic high level to the logic low level and the logic level of the i-th internal address signal CNTi−1 transitions from the logic low level to the logic high level because the second transmission gate TG2 turns on.

Each of counters 210a through 210n may reset the internal address signal CNTi−1 in response to the refresh reset signal RST. After the reset operation, the logic level of the internal address signal CNTi−1 may become the first logic level, such as a logic low level. The (i−1)-th internal address signal CNTi−2 is input to the counter 210i and the i-th internal address signal CNTi−1 is output from the counter 210i. A period of the i-th internal address signal CNTi−1 may be twice as long as a period of the (i−1)-th internal address signal CNTi−2.

Figure 4:
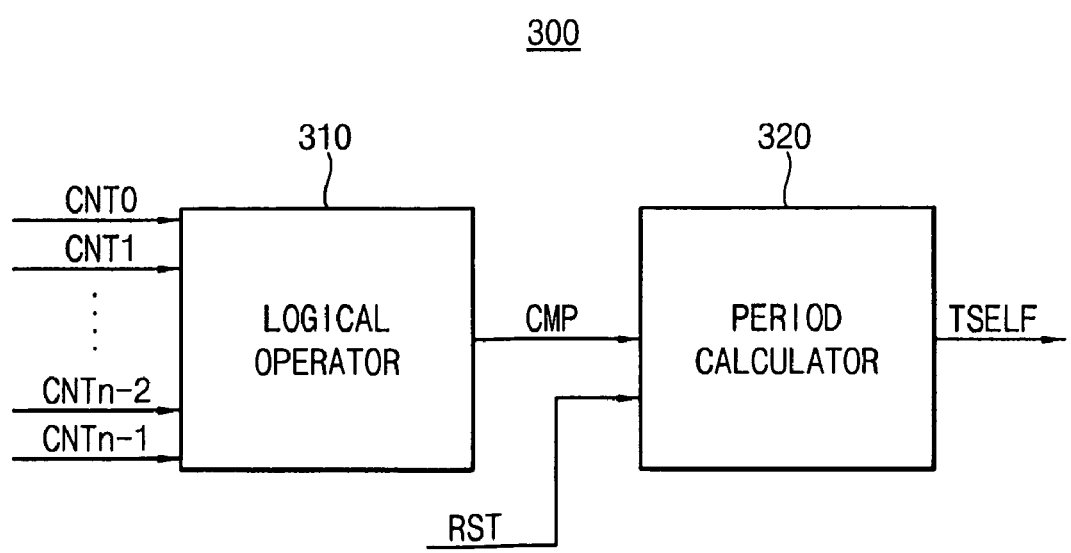
FIG. 4 is a block diagram illustrating an exemplary embodiment of a period detector included in the semiconductor memory device of FIG. 1.

FIG. 4 is a block diagram illustrating an exemplary embodiment of the period detector 300 included in the semiconductor memory device 10 of FIG. 1.

Referring to FIG. 4, the period detector 300 may include a logical operator 310 and a period calculator 320.

The logical operator 310 receives the internal address signals CNT0 through CNTn−1 from the address counter 200 and generates a refresh completion signal CMP. The period calculator 320 receives the refresh reset signal RST from the controller 100, receives the refresh completion signal CMP from the logical operator 310 and detects the self refresh period based on the refresh reset signal RST and the refresh completion signal CMP to generate the self refresh period signal TSELF.

Figure 5:
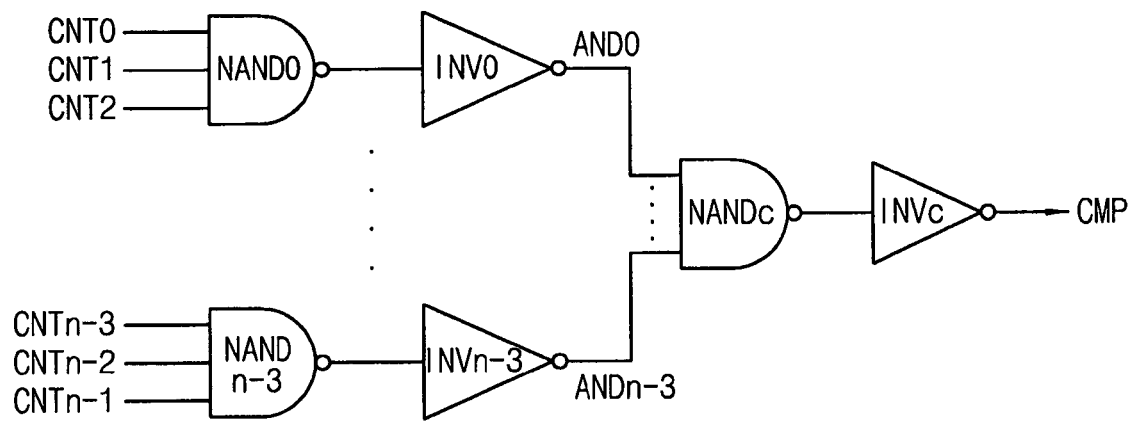
FIG. 5 is a circuit diagram illustrating an exemplary embodiment of a logical operator included in the period detector of FIG. 4.

FIG. 5 is a circuit diagram illustrating an exemplary embodiment of the logical operator 310 included in the period detector 300 of FIG. 4.

Referring to FIG. 5, the logical operator 310 may include a plurality of NAND gates NAND0, NAND1, . . . , NANDn−3, and NANDc and a plurality of inverters INV0, INV1, . . . , INVn−3 and INVc.

The plurality of NAND gates NAND0 through NANDn−3 performs a NAND operation on the plurality of internal address signals, respectively. The plurality of inverters INV0 through INVn−3 invert an output signal of the NAND gates NAND0 through NANDn−3 to provide a plurality of AND operation signals AND0, AND1, . . . , ANDn−3 to a completion NAND gate NANDc, respectively. For example, a first NAND gate NAND0 performs the NAND operation on a first internal address signal CNT0, a second internal address signal CNT1 and a third internal address signal CNT2. A first inverter INV0 inverts an output signal of the first NAND gate NAND0 to provide a first AND operation signal AND0 to the completion NAND gate NANDc. The first AND operation signal AND0 may be substantially the same as a signal generated from performing an AND operation on the first, second and third internal address signals CNT0, CNT1 and CNT2. A NAND gate NANDn−3 performs the NAND operation on an internal address signal CNTn−3, an internal address signal CNTn−2 and a internal address signal CNTn−1. An inverter INVn−3 inverts an output signal of the NAND gate NANDn−3 to provide an AND operation signal ANDn−3 to the completion NAND gate NANDc. The AND operation signal ANDn−3 may be substantially the same as a signal generated from performing an AND operation on the first, second and third internal address signals CNTn−3, CNTn−2 and CNTn−1.

The completion NAND gate NANDc performs the NAND operation on the plurality of the AND operation signals AND0 through ANDn−3. A completion inverter INVc inverts an output signal of the completion NAND gate NANDc to provide the refresh completion signal CMP to the period calculator 320. Thus, the refresh completion signal CMP may be substantially the same as a signal generated from performing the AND operation on the plurality of internal address signals CNT0 through CNTn−1.

The address counter 200 may reset the internal address signals CNT0 through CNTi−1 in response to the refresh reset signal RST such that the logic level of the internal address signals CNT0 through CNTi−1 may become the first logic level, such as a logic low level, after the reset operation. The address counter 200 may up-count the internal address and the logic levels of the internal address signals CNT0 through CNTn−1 may be sequentially changed. Thus, the refresh completion signal CMP may be enabled by the logical operator 310 when the logic levels of all of the internal address signals CNT0 through CNTn−1 transition to the second logic level, such as a logic high level. For example, the refresh completion signal CMP may be enabled when the logic levels of all of the internal address signals CNT0 through CNTn−1 transition from a logic low level to a logic high level.

In another exemplary embodiment, the logical operator 310 may include a plurality of NOR gates and a plurality of inverters. In this case, the first logic level may be a logic high level and the second logic level may be a logic low level. The address counter 200 may reset the internal address signals CNT0 through CNTi−1 in response to the refresh reset signal RST such that the logic levels of the internal address signals CNT0 through CNTi−1 may become a logic high level. The address counter 200 may down-count the internal address and the logic levels of the internal address signals CNT0 through CNTn−1 may be sequentially changed. The refresh completion signal CMP may be enabled by the logical operator 310 when the logic levels of all of the internal address signals CNT0 through CNTn−1 transition to logic low level.

Referring back to the FIG. 4, the period detector 320 determines the enable time of the refresh reset signal RST as the starting point of the self refresh period and determines the enable time of the refresh completion signal CMP as the ending point of the self refresh period. The period detector 320 detects the self refresh period by calculating a time difference between the ending point of the self refresh period and the starting point of the self refresh period and generates the self refresh period signal TSELF indicating the self refresh period. Thus, the semiconductor memory device 10 according to the exemplary embodiments may estimate the self refresh period simply and effectively, whereas conventional semiconductor memory devices periodically detect and store the internal address signals CNT0 through CNTn−1.

Figure 6:
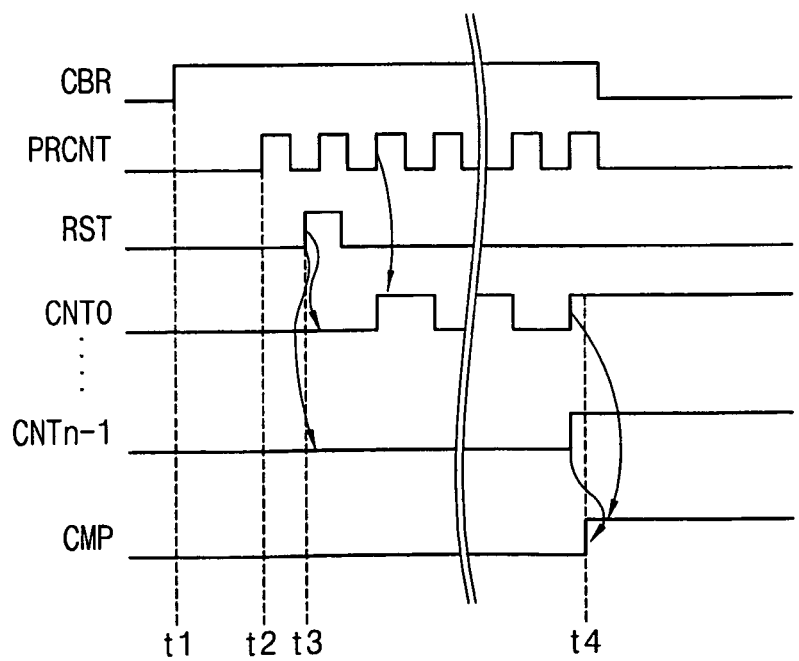
FIG. 6 is a timing diagram illustrating a self refresh operation of the semiconductor memory device of FIG. 1.

FIG. 6 is a timing diagram illustrating the self refresh operation of the semiconductor memory device 10 of FIG. 1.

Referring to FIG. 6, at time t1, the self refresh initiation signal CBR is enabled. The column selection circuit included in the memory cell array is deactivated, and the row selection circuit included in the memory cell array prepares to perform the self refresh operation based on the internal address signals, not based on external address signals. However, the auto refresh signal PRCNT and the self refresh initiation signal CBR are not generated simultaneously because the oscillator 500 generates the auto refresh signal PRCNT after the predetermined setting time has elapsed. The starting point of the self refresh operation may be different from the enable time of the self refresh initiation signal CBR.

At time t2, the oscillator 500 generates the auto refresh signal PRCNT. It is difficult to exactly determine a time difference between time t2 and time t1. Thus, at time t3, the controller 100 enables the refresh reset signal RST and the address counter 200 resets the internal address signals CNT0 through CNTn−1 in response to the refresh reset signal RST such that all of the logic levels of the internal address signals CNT0 through CNTn−1 become the first logic level. The refresh reset signal RST may be generated after the auto refresh signal PRCNT is stabilized and the first logic level may be a logic low level. The period detector 300 determines the enable time of the refresh reset signal RST as the starting point of the self refresh period. When all of the logic levels of the internal address signals CNT0 through CNTn−1 are the first logic level, the logic level of the refresh completion signal CMP is also the first logic level.

The address counter 200 performs the counting operation. For example, the address counter 200 may sequentially change the logic levels of the internal address signals CNT0 through CNTn−1 synchronously with the auto refresh signal PRCNT. After the counting operation is completed, all of the logic levels of the internal address signals CNT0 through CNTn−1 transition to the second logic level. The second logic level may be a logic high level. Thus, at time t4, the refresh completion signal CMP is enabled. For example, the refresh completion signal CMP transitions from the first logic level to the second logic level.

In an exemplary embodiment, the internal address may include six bits, that is, the number of the internal address signals n may be six. The address counter 200 may reset the internal address signals and a value of the internal address may be '000000'. The address counter 200 may sequentially up-count the internal address signals to change the value of the internal address and may provide the internal address signals to the period detector 300. The address counter 200 may perform the up-counting operation in response to a rising edge or a falling edge of the auto refresh signal PRCNT. If the up-counting operation does not complete and at least one of the logic levels of the internal address signals is a logic low level, for example, the value of the internal address is '001010' and the refresh completion signal CMP is not enabled. When the up-counting operation completes and all of the logic levels of the internal address signals are a logic high level, for example, the value of the internal address is '111111' and the refresh completion signal CMP is enabled. For example, the refresh completion signal CMP may transition from the logic low level to the logic high level.

In a conventional semiconductor memory device, a period detector periodically detects the auto refresh signal PRCNT or the first internal address signal CNT0 to sense a first transition time of the first internal address signal CNT0 or a time at which the address counter 200 generates the internal address. The first transition time of the first internal address signal CNT0 indicates a time at which the logic level of the first internal address signal CNT0 transitions from the first logic level to second logic level. The period detector may determine the first transition time as the starting point of the self refresh operation. The period detector periodically detects the n-th internal address signal CNTn−1 to sense a second transition time of the n-th internal address signal CNTn−1 that indicates a time at which the logic level of the n-th internal address signal CNTn−1 transitions from the first logic level to second logic level. The period detector may determine the second transition time as the ending point of the self refresh operation. In another case, the number of rows of the memory cell array is 2n when the internal address includes n bits (n is a natural number) and the self refresh operation is completed after (2n−1) periods of the first internal address signal CNT0 have elapsed. Thus, the period detector may estimate a single period of the first internal address signal CNT0 and may determine the self refresh period by multiplying the single period of the first internal address signal CNT0 to 2n−1.

The period detector included in the conventional semiconductor memory device needs to detect a logic level of the first internal address signal CNT0, store the detected logic level, and compare the stored logic level to determine the first and second transition times. Thus, the period detector has to further include a detecting unit, a storing unit, and the like, and it is difficult to estimate the self refresh period exactly and rapidly because of additional operations and an estimating error.

In the semiconductor memory device and the method of the exemplary embodiments of the present inventive concept, the period detector 300 determines the enable time of the refresh reset signal RST (time t3) as the starting point of the self refresh period, determines the enable time of the refresh completion signal CMP (time t4) as the ending point of the self refresh period, and detects the self refresh period by calculating the time difference between to the ending point of the self refresh period and the starting point of the self refresh period to generate the self refresh period signal TSELF. Thus, the semiconductor memory device 10 according to the exemplary embodiments may estimate the self refresh period exactly and rapidly, whereas conventional semiconductor memory devices periodically detect and store the internal address signals.

Figure 7:
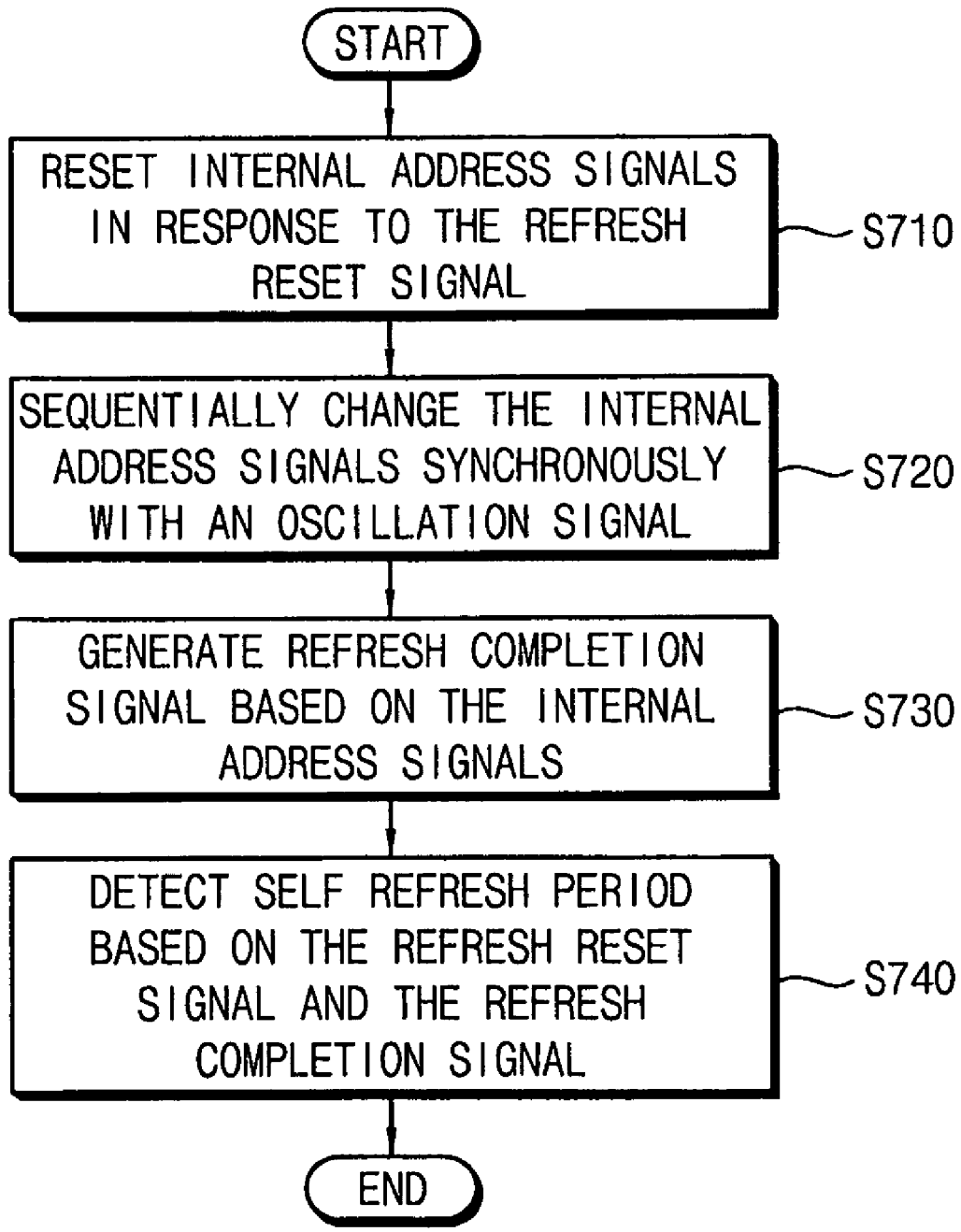
FIG. 7 is a flow chart illustrating a method of estimating a self refresh period, according to an exemplary embodiment of the present inventive concept.

FIG. 7 is a flow chart illustrating a method of estimating a self refresh period according to an exemplary embodiment of the present inventive concept.

Referring to FIG. 7, in a normal mode, when a predetermined timing condition is satisfied in a semiconductor memory device to perform a self refresh operation, a refresh reset signal RST is not enabled. For example, the predetermined timing condition may be satisfied if a predetermined time has elapsed after a CAS signal is applied and prior to a RAS signal.

In a test mode, the refresh reset signal RST is generated and a self refresh initiation signal CBR is generated, even though the semiconductor memory device does not satisfy the above-mentioned predetermined timing condition. A starting point of a self refresh period is exactly determined based on the refresh reset signal RST. If the semiconductor memory device does not include a refresh period detector, the refresh reset signal RST may be provided from an external device, such as tester. The semiconductor memory device may not satisfy the predetermined timing condition, when the semiconductor memory device receives the refresh reset signal RST from the external device. The self refresh operation may be performed for determining whether the semiconductor memory device is passed or failed.

In step S710, a plurality of internal address signals are reset in response to the refresh reset signal RST. Each of the internal address signals may correspond to a single bit of an internal address that has a number of bits corresponding to the number of rows of a memory cell array. After the reset operation, logic levels of all of the internal address signals may become a first logic level, such as logic low level. The plurality of internal address signals are generated by an address counter. The address counter may be a ripple counter and the address counter may be an up-counter or a down counter.

In step S720, the internal address signals are sequentially changed synchronously with an oscillation signal, such as an auto refresh signal generated from the oscillator. The address counter may perform the changing operation by up-counting or down-counting the internal address signals and the memory cell array may perform the self refresh operation in response to the internal address signals. When the self refresh operation is completed, logic levels of all of the internal address signals may transition to a second logic level, such as a logic high level.

In step S730, a refresh completion signal CMP is generated in response to the internal address signals. When logic levels of all of the internal address signals transition to the second logic level, the logical operator 310 of FIG. 4 included in the period detector 300 may enable the refresh completion signal CMP by performing a logical operation on the internal address signals. For example, the logical operator 310 may perform an AND operation on the internal address signals to enable the refresh completion signal CMP, when the first logic level is a logic low level and the second logic level is a logic high level. In another example, the logical operator 310 may perform an OR operation on the internal address signals to enable the refresh completion signal CMP, when the first logic level is a logic high level and the second logic level is a logic low level. The refresh completion signal CMP may be disabled when at least one of the logic levels of the internal address signals is the first logic level and may be enabled when the logic levels of all of the internal address signals are the second logic level.

In step S740, the self refresh period is detected based on the refresh reset signal RST and the refresh completion signal CMP. For example, the period calculator 320 of FIG. 4 included in the period detector 300 may detect a time difference between the enable time of the refresh completion signal CMP and the enable time of the refresh reset signal RST to generate a self refresh period signal TSELF indicating the self refresh period.

In the method of estimating the self refresh period according to the exemplary embodiments, the self refresh period may be exactly detected based on the refresh reset signal RST and the refresh completion signal CMP, whereas the conventional method of estimating the self refresh period periodically detects a voltage level of the oscillation signal. Thus, the method of the exemplary embodiments may estimate the self refresh period exactly and rapidly. In addition, it may be determined whether the semiconductor memory device is passed or failed based on the estimated self refresh period. For example, the semiconductor memory device is passed, when the estimated self refresh period is within a tolerance of a reference self refresh period and the semiconductor memory device is failed, when the estimated self refresh period is out of the tolerance of the reference self refresh period.

Figure 8:
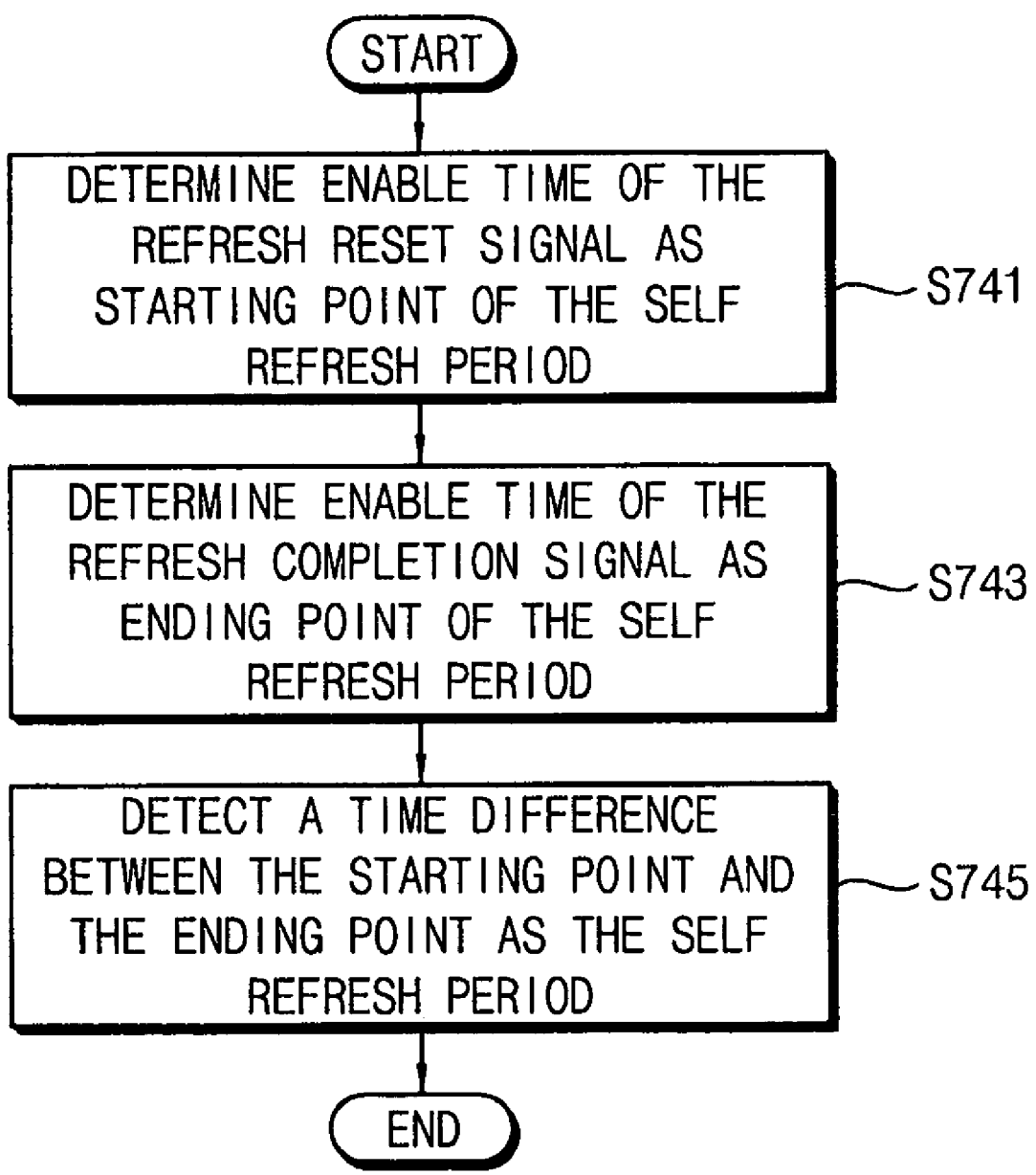
FIG. 8 is a flow chart illustrating a method of detecting a self refresh period, according to an exemplary embodiment of the present inventive concept.

FIG. 8 is a flow chart illustrating an exemplary embodiment of detecting the self refresh period.

Referring to FIG. 8, in step S741, the enable time of the refresh reset signal RST is determined as the starting point of the self refresh period. In step S743, the enable time of the refresh completion signal CMP is determined as the ending point of the self refresh period. In step S745, the self refresh period is detected by calculating the time difference between the enable time of the refresh completion signal and the enable time of the refresh reset signal. The steps S741, S743 and S745 may be performed by the period calculator 320 of FIG. 4. The steps S741, S743 and S745 may correspond to the step S740 of FIG. 7.

Figure 9:
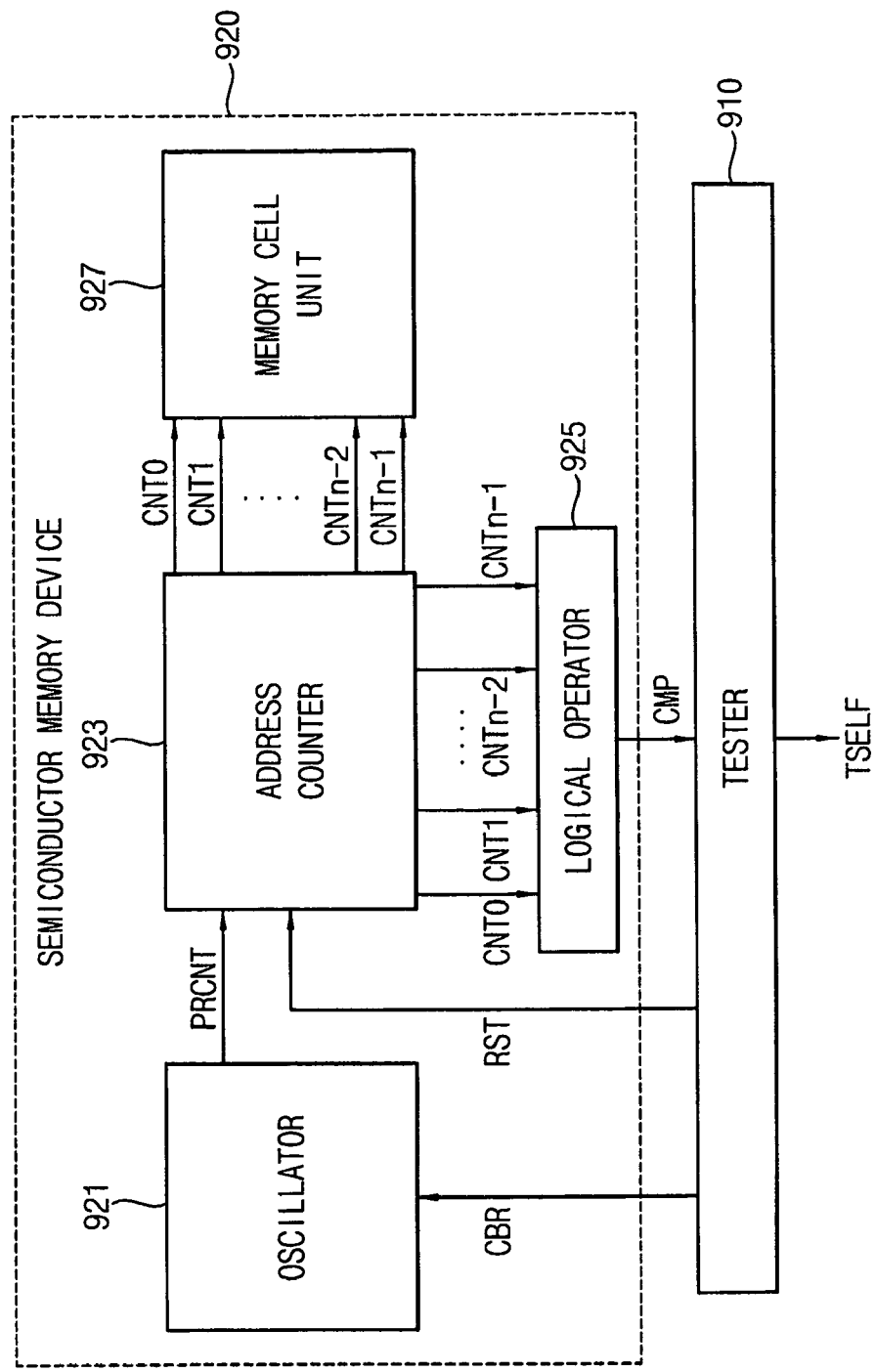
FIG. 9 is a block diagram illustrating a test system for estimating a self refresh period, according to an exemplary embodiment of the present inventive concept.

FIG. 9 is a block diagram illustrating a test system 90 for estimating a self refresh period according to some example embodiments.

Referring to FIG. 9, the test system 90 includes a tester 910 and a semiconductor memory device 920.

In a normal mode, a refresh reset signal RST is not enabled, an internal address is not reset and a self refresh operation is internally performed. Thus, it is difficult to exactly estimate a self refresh period. In the test system 90 according to the example embodiments, tester 910 provides a self refresh initiation signal CBR and the refresh reset signal RST and the semiconductor memory device 920 externally performs the self refresh operation. The tester 910 may effectively estimate the self refresh period thereby enhancing the productivity of the semiconductor memory device 920.

The semiconductor memory device 920 may communicate with the tester 910 through various types of interface protocols, such as a Universal Serial Bus (USB), a Multi-Media Card (MMC), a Peripheral Component Interconnect Express (PCI-E), a Serial Advanced Technology Attachment (SATA), a Parallel ATA (PATA), a Small Computer System Interface (SCSI), an Enhanced Small Disk Interface (ESDI) and an Integrated Drive Electronics (IDE).

The semiconductor memory device 920 may include an oscillator 921, an address counter 923, a logical operator 925 and a memory cell unit 927. The semiconductor memory device 920 may further include an interface unit for communicating with the tester 910.

The oscillator 921 may be the oscillator 500 of FIG. 1. The oscillator 921 receives the self refresh initiation signal CBR from the tester 910 and generates an auto refresh signal PRCNT after a predetermined setting time has elapsed.

The address counter 923 may be the address counter 200 of FIGS. 1 and 2A. The address counter 923 may include a plurality of counters such that each of counters may be the counter 210*i* of FIG. 2B. The address counter 923 receives the refresh reset signal RST from the tester 910 and generates a plurality of internal address signals CNT0, CNT1, . . . , CNTn−2, and CNTn−1. The address counter 923 resets the plurality of internal address signals CNT0 through CNTn−1 to a first logic level, such as a logic low level. The address counter 923 sequentially changes the internal address signals CNT0 through CNTn−1 to perform the self refresh operation.

The logical operator 925 may be the logical operator 310 of FIGS. 4 and 5. The logical operator 925 generates the refresh completion signal CMP in response to the internal address signals CNT0 through CNTn−1. The self refresh operation is completed when the logic levels of all of the internal address signals CNT0 through CNTn−1 transition to a second logic level, such as a logic high level. The refresh completion signal CMP is enabled when the self refresh operation is completed.

The memory cell unit 927 may be the memory cell unit 400 of FIG. 1. The memory cell unit 927 receives the internal address signals CNT0 through CNTn−1 to select each row of a memory cell array included in the memory cell unit 927. The memory cell unit 927 senses data stored in the memory cells of the selected row through bit lines, amplifies the sensed data and re-writes the amplified data to perform the self refresh operation.

The tester 910 generates the self refresh initiation signal CBR and the refresh reset signal RST. The tester 910 detects the self refresh period based on the refresh reset signal RST and the refresh completion signal CMP. The tester 910 generates a self refresh period signal TSELF indicating the self refresh period.

Figure 10:
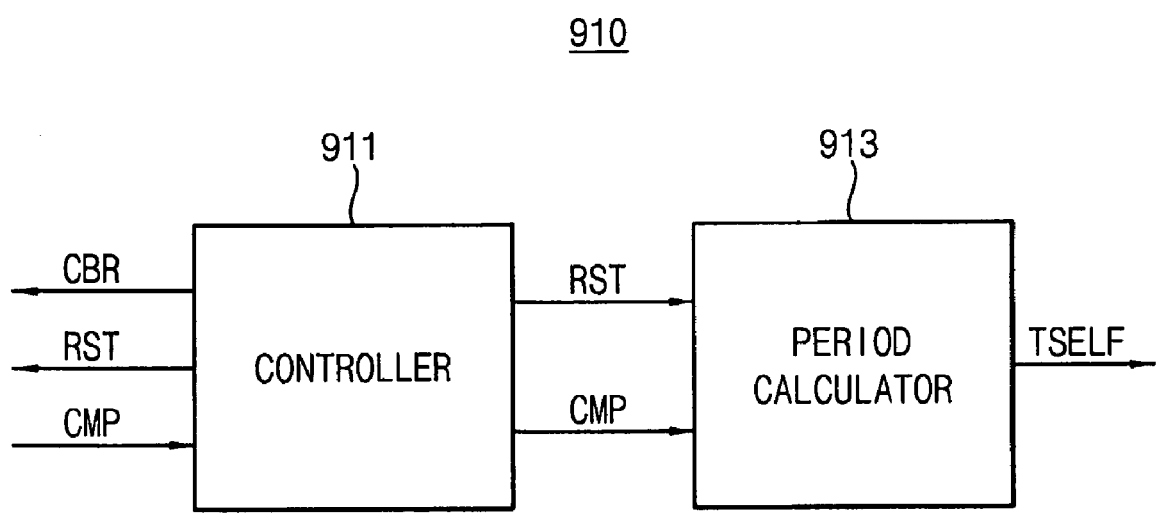
FIG. 10 is a block diagram illustrating a tester included in the test system of FIG. 9.

FIG. 10 is a block diagram illustrating the tester 910 included in the test system 90 of FIG. 9.

Referring to FIG. 10, the tester 910 may include a controller 911 and a period calculator 913.

The controller 911 may be the controller 100 of FIG. 1. The controller 911 generates the self refresh initiation signal CBR and the refresh reset signal RST for estimating the self refresh period. The refresh reset signal RST is generated after the auto refresh signal PRCNT is generated and stabilized in the semiconductor memory device 920.

The period calculator 913 may be the period calculator 320 of FIG. 4. The period calculator 913 determines an enable time of the refresh reset signal RST as a starting point of the self refresh period and determines an enable time of the refresh completion signal CMP as the ending point of the self refresh period. The period calculator 913 detects the self refresh period by calculating the time difference between the enable time of the refresh completion signal CMP and the enable time of the refresh reset signal RST and generates the self refresh period signal TSELF indicating the self refresh period.

The test system according to exemplary embodiments may detect the self refresh period by calculating the time difference between the enable time of the refresh completion signal CMP and the enable time of the refresh reset signal RST, whereas conventional test systems periodically detect and store the internal address signals CNT0 through CNTn−1. Thereby, the test system according to the exemplary embodiments reduces power consumption and estimates the self refresh period exactly and effectively.

The method according to the exemplary embodiments may be applicable to a semiconductor memory device that includes a DRAM or a Pseudo Static RAM (PSRAM). Cell structures of the PSRAM may be substantially the same as cell structures of the DRAM, whereas operations of the PSRAM may be substantially the same as operations of the SRAM. Each of the memory cells of the PSRAM includes one transistor and one capacitor, so that the PSRAM may be referred to as a unit transistor RAM (UtRAM).

The PSRAM overcomes various problems that may occur during the self refresh operations of the DRAM. As the memory device becomes smaller, the memory cells including the capacitor also become smaller, and, thus, the charge stored on the capacitor as data may be refreshed faster than before. However, when the self refresh operation is performed on the memory cells, the data may not be accessible and, thus, the overall operation performance may be degraded. Thus, the PSRAM may perform the reading, writing, and self refresh operations in one period for improving the overall operation performance. The PSRAM may operate as the SRAM as seen from the exterior and has the high density features of the DRAM. The method according to exemplary embodiments may exactly estimate the self refresh period, thereby improving the reliability of the PSRAM.

As described above, the method according to exemplary embodiments may be used in a semiconductor memory device to perform a self refresh operation and in a portable device including the semiconductor memory device. The method according to exemplary embodiments may also be used in a test system that estimates a self refresh period for determining whether the tested semiconductor memory device is passed or failed.

While the exemplary embodiments and their advantages have been described in detail, it should be understood that various changes, substitutions and alterations may be made herein without departing from the scope of the inventive concept.

What is claimed is:

1. A method of estimating a self refresh period of a semiconductor memory device, the method comprising:
resetting a plurality of internal address signals in response to a refresh reset signal in a test mode;
sequentially changing the plurality of internal address signals synchronously with an oscillation signal;
generating a refresh completion signal based on the plurality of internal address signals; and
detecting the self refresh period based on the refresh reset signal and the refresh completion signal.

2. The method of claim 1, wherein generating the refresh completion signal includes:
generating the refresh completion signal by performing a logical operation on the plurality of the internal address signals.

3. The method of claim 1, wherein detecting the self refresh period includes:
determining an enable time of the refresh reset signal as a starting point of the self refresh period;
determining an enable time of the refresh completion signal as a ending point of the self refresh period; and
detecting the self refresh period by calculating a time difference between the ending point of the self refresh period and the starting point of the self refresh period.

4. The method of claim 1, wherein resetting the plurality of internal address signals includes:
setting logic levels of all of the plurality of internal address signals to a first logic level in response to the refresh reset signal.

5. The method of claim 4, wherein generating the refresh completion signal includes:
enabling the refresh completion signal when the logic levels of all of the plurality of internal address signals transition to a second logic level from the first logic level.

6. The method of claim 5, wherein the refresh completion signal is enabled by performing an AND operation on the plurality of the internal address signals when the first logic level is a logic low level and the second logic level is a logic high level or by performing an OR operation on the plurality of the internal address signals when the first logic level is a logic high level and the second logic level is a logic low level.

7. The method of claim 1, wherein the refresh reset signal is enabled after the oscillation signal is stabilized.

8. The method of claim 1, wherein the refresh reset signal is applied from an external device.

9. The method of claim 1, wherein the refresh reset signal is disabled in a normal mode.

10. The method of claim 1, further comprising:
determining whether the semiconductor memory device is passed or failed based on a tolerance of a reference self refresh period.

11. A semiconductor memory device comprising:
an oscillator configured to generate an auto refresh signal in response to a self refresh initiation signal;
an address counter configured to reset a plurality of internal address signals in response to a refresh reset signal and configured to sequentially change the plurality of internal address signals synchronously with the auto refresh signal; and
a period detector configured to generate a self refresh period signal based on the plurality of internal address signals and the refresh reset signal.

12. The semiconductor memory device of claim 11, wherein the period detector includes:
a logical operator configured to perform a logical operation on the plurality of internal address signals to generate a refresh completion signal; and
a period calculator configured to generate the self refresh period signal based on the refresh reset signal and the refresh completion signal.

13. The semiconductor memory device of claim 12, wherein the period calculator determines an enable time of the refresh reset signal as a starting point of the self refresh period, determines an enable time of the refresh completion signal as a ending point of the self refresh period and calculates a time difference between the ending point of the self refresh period and the starting point of the self refresh period to generate the self refresh period signal.

14. The semiconductor memory device of claim 12, wherein the address counter resets logic levels of all of the plurality of internal address signals to a first logic level in response to the refresh reset signal.

15. The method of claim 14, wherein the address counter enables the refresh completion signal when the logic levels of all of the plurality of internal address signals transition to a second logic level from the first logic level.

16. The semiconductor memory device of claim 11, wherein the address counter includes:
a plurality of counters cascade-coupled from a first stage to a last stage, each of the plurality of counters generating one of the plurality of internal address signals.

17. The semiconductor memory device of claim 16, wherein each of the plurality of counters includes:
an inverter configured to invert the refresh reset signal; and
a plurality of transistors configured to provide a source voltage in response to the inverted refresh reset signal.

18. A test system comprising:
a semiconductor memory device configured to generate an auto refresh signal in response to a self refresh initiation signal, configured to reset a plurality of internal address signals in response to a refresh reset signal, configured to sequentially change the plurality of internal address signals synchronously with the auto refresh signal and configured to generate a refresh completion signal based on the plurality of internal address signals; and
a tester configured to generate the self refresh initiation signal and the refresh reset signal and configured to generate the self refresh period signal based on the refresh reset signal and the refresh completion signal.

19. The test system of claim 18, wherein the semiconductor memory device includes:
an oscillator configured to generate the auto refresh signal in response to the self refresh initiation signal;
an address counter configured to reset the plurality of internal address signals in response to the refresh reset signal and configured to sequentially change the plurality of internal address signals synchronously with the auto refresh signal
a logical operator configured to generate the refresh completion signal based on the plurality of internal address signals.

20. The test system of claim 18, wherein the tester includes:
a controller configured to generate the self refresh initiation signal and the refresh reset signal; and
a period calculator configured to generate the self refresh period signal based on the refresh reset signal and the refresh completion signal.

* * * * *